United States Patent [19]

Yamada et al.

[11] Patent Number: 5,268,410
[45] Date of Patent: Dec. 7, 1993

[54] METHOD FOR PRODUCING A LIQUID CRYSTAL POLYESTER RESIN COMPOSITION HAVING PLATING STRENGTH

[75] Inventors: Jun Yamada, Yokohama; Hideo Watanabe, Tokyo; Tetsuo Shimizu, Yokosuka, all of Japan

[73] Assignee: Nippon Petrochemicals Company, Limited, Tokyo, Japan

[21] Appl. No.: 968,239

[22] Filed: Oct. 29, 1992

Related U.S. Application Data

[63] Continuation of Ser. No. 689,198, Apr. 22, 1991, abandoned.

[30] Foreign Application Priority Data

Apr. 23, 1990 [JP] Japan ................... 2-106851

[51] Int. Cl.$^5$ ................... C08J 5/10; C08K 3/26; C08L 31/06
[52] U.S. Cl. ................... 524/425; 524/424
[58] Field of Search ................... 524/424, 425

[56] References Cited

U.S. PATENT DOCUMENTS 4,888,227 12/1989 Wada et al. ................... 524/847
4,997,724 3/1991 Suzuki et al. ................... 428/626

Primary Examiner—Paul R. Michl
Assistant Examiner—U. K. Rauguru
Attorney, Agent, or Firm—Scully, Scott, Murphy & Presser

[57] ABSTRACT

A resin composition of wholly-aromatic thermotropic liquid crystal polyester resin containing 5 to 60% by weight of an inorganic filler selected from carbonates of alkaline earth metals, which is characterized in that the moisture content of the component materials to be fed to the melting step in preparation process of said composition is 0.1% by weight or lower. The resin composition and its formed articles are quite excellent in external appearance, thermal resistance, workability in plastics forming and especially in plating strength suitable for applying metal plating thereon.

6 Claims, No Drawings

METHOD FOR PRODUCING A LIQUID CRYSTAL POLYESTER RESIN COMPOSITION HAVING PLATING STRENGTH

This is a continuation of copending application(s) Ser. No. 689,198 filed on Apr. 22, 1991 now abandoned.

BACKGROUND OF THE INVENTION

(1) Field of the Invention

This invention relates to a resin composition, articles which is made of the composition, and a method for producing the same, wherein the resin composition excels in thermal resistance and workability in forming, and also especially excellent in adherence in metal plating and external appearance.

(2) Description of Prior Art

When the surfaces of resin articles are applied with metal plating, it is necessary that the properties of resin surfaces are suitable for receiving the treatment of metal plating. More particularly, the condition of the surface of resin must exhibit sufficient adherence to a plated layer (hereinafter referred to as "plating strength").

When metal plating is applied to the surfaces of formed articles which are made of wholly-aromatic thermotropic liquid crystal polyester resin, the articles to be plated are formed using a resin composition containing an inorganic filler that is soluble in an acid or an alkaline solution, and the surfaces of obtained resin articles are then etched with an acid or an alkali solution, thereby dissolving or modifying all of or a part of the inorganic filler existing in the surfaces of articles, and converting the surfaces of resin into a condition suitable for the metal plating. In this treatment, because the plated layers are caught by the surfaces of articles with the so-called anchor effect, it is also necessary for increasing the plating strength that the mechanical strength of the surfaces of articles is large enough.

However, owing to the higher melting points of wholly-aromatic liquid crystal polyester resins, they are liable to be hydrolyzed by coexisting moisture. This phenomenon is accelerated by the catalytic action of the contained acid- or alkali-soluble inorganic fillers themselves or other metallic components contained in the fillers. Furthermore, the reaction is sometimes caused to proceed by the acid which is produced by decomposition. As a result, decomposed products are often produced in wholly-aromatic liquid crystal polyester resins.

The coexisting moisture in a resin composition is derived from the one contained in inorganic fillers such as calcium carbonate or the one that is adsorbed by the resin itself. In the case of wholly-aromatic polyesters, the quantity of moisture that is adsorbed by the resin itself is very small, however, even though the quantity of moisture is trace, the reaction of hydrolysis proceeds rapidly because the melting point is high.

Accordingly, the liability to hydrolysis must always be taken into consideration in the case of wholly-aromatic polyester resin compositions containing inorganic fillers.

In the case of ordinary resins, molecules of molten resin are disposed at random in the molten state in heating. However, the thermotropic liquid crystal resin is characterized to exhibit the liquid crystal property when it is applied with shearing stress in a molten state. This fact means that the resin is easily oriented and is caused to flow in the molten state. Owing to this fact, in the case that less viscous substances such as decomposed products exist in a resin, they tend to be transferred to the surface portion of molten resin, that is, the boundary with wall surface.

As a result, the decomposed product is converged at surface portions. Even though the quantity of decomposed products is very small as compared with the quantity of the whole resin, the condition of surface is largely influenced by this convergence at the surface portion.

In an ordinary resin, for example, in a simple non-liquid crystal polyester resin, if it is of crystalline nature, the convergence of foreign substances at the surface portions of melt-molded articles is sometimes observed. (In the case of the non-liquid crystal resin, the foreign substances are considered to be low molecular weight resins.) However, in the case of these resins, the quantity of transfer is smaller, beyond comparison, than in the case of the liquid crystal polymer.

However, in the thermotropic liquid crystal polymer, the mass-transfer of less viscous substances such as decomposed products is caused to occur quite easily. In other words, in the case of the thermotropic liquid crystal polymer, foreign substances (decomposed products) are easily shifted to surface portions even when the quantity of the foreign substances is very small, as described in the foregoing paragraph. Therefore, it is considered that the influence of decomposed products on the surface portion is much larger beyond comparison than in the case of a non-liquid crystal resin, even when the quantity of decomposed products is quite small.

For example, it is described in European Patent Publication No. 311232 (A) relating to liquid crystal polyester resin composition for metal plating, in Comparative Example, that the composition containing calcium carbonate is not desirable (ibid., Example 4, Method for preparing test pieces; and Comparative Example 11).

In the same Comparative Example, after preparing pellets by melting and mixing a resin and an inorganic filler, the pellets are dried and test pieces are formed after the drying. In this preparation of pellets, the resin is melted by heating together with the filler. That is, because the resin is melted together with the filler in the presence of water, hydrolysis is already caused to occur in the resin. This hydrolyzed product is concentrated to the surfaces of formed articles of the resin. Therefore, it is supposed that the plating strength of resin articles is lowered. Once decomposed products are generated, it is considered natural that they produce undesirable influences on the metal plating process of formed articles unless they are removed from the polymer. In addition, such removal is not easy.

Incidentally, the foregoing hydrolyzed products in surface layer cannot be easily removed by the conventional pretreatment for metal plating process using treating solutions such as etching solutions, or organic solvents which are used by mixing with the etching solutions or used together. Even when the removal is possible, it is only limited to the case in which the hydrolysis proceeds to a considerable extent. On the other hand, in the case that the hydrolysis does not so proceed and some decomposed products are left unremoved or remained, it is considered that the remaining substances produce undesirable influences on the surfaces of formed articles in the process of metal plating. Therefore, it is inevitable to avoid the occurrence of hydrolysis.

Furthermore, the liquid crystal polyester resins are proposed for a fresh development of the next generation to use for electric and electronic parts and accessories. In these uses, the metal plating is an inevitable requirement.

BRIEF SUMMARY OF THE INVENTION

It is, therefore, the object of the present invention to solve the problems residing in the foregoing wholly-aromatic liquid crystal polyester composition containing an inorganic filler such as calcium carbonate and in the formed articles made of the composition.

The primary point of the present invention relates to a resin composition of wholly-aromatic thermotropic liquid crystal polyester resin and formed articles made of the composition. The composition contains 5 to 60% by weight of inorganic fillers of carbonates of alkaline earth metals and it is characterized in that the moisture content of the material which is fed to a melting step in preparation is 0.1% by weight or less.

The secondary point of the present invention is a method for preparing the resin composition which is characterized in that a mixture of wholly-aromatic thermotropic liquid crystal polyester resin containing 5 to 60% by weight of inorganic fillers of carbonates of alkaline earth metals and moisture content of 0.1% by weight or lower, is fed to the melting step.

DETAILED DESCRIPTION OF THE INVENTION

The present invention will be described in more detail.

The term "thermotropic liquid crystal polymer" as referred to herein indicates a thermoplastic meltable polymer which exhibits optical anisotropy in a molten state. Such a polymer which exhibits optical anisotropy on melting has a property that its molecular chains are arranged in regular parallel relationship in a molten state. The property of the optically anisotropic molten phase can be determined by a conventional polarizing inspection method utilizing an orthogonal polarizer.

The thermotropic liquid crystal polymer is prepared from a monomer having a plurality of extended chain linkages which are generally elongated, flat, rigid in longitudinal direction and either in coaxial or in parallel relationship.

The following aromatic compounds are ester-components of the wholly-aromatic polyester resins which form an optically anisotropic melt phase as described above:

(A) at least one of aromatic dicarboxylic acid compounds and alicyclic dicarboxylic acid compounds;

(B) at least one of aromatic hydroxycarboxylic acid compounds;

(C) at least one of aromatic diols, alicyclic diols and aliphatic diols;

(D) at least one of aromatic dithiols, thiophenols and aromatic mercaptocarboxylic acids and mercaptophenols; and (E) at least one of aromatic hydroxylamines and aromatic diamines.

These compounds are used singly in some cases, however, they are used in many cases in combination of (A) and (C); (A) and (D); (A), (B) and (C); (A), (B) and (E); or (A), (B), (C) and (E).

Exemplified as the above aromatic dicarboxylic acid compounds (A1) are aromatic dicarboxylic acids such as terephthalic acid, 4,4'-diphenyldicarboxylic acid, 4,4'-triphenyldicarboxylic acid, 2,6-naphthalenedicarboxylic acid, diphenyl ether-4,4'-dicarboxylic acid, diphenoxyethane-4,4'-dicarboxylic acid, diphenoxybutane-4,4'-dicarboxylic acid, diphenylethane-4,4'-dicarboxylic acid, isophthalic acid, diphenyl ether-3,3'-dicarboxylic acid, diphenoxyethane-3,3'-dicarboxylic acid, diphenylethane-3,3'-dicarboxylic acid, and naphthalene-1,6-dicarboxylic acid; as well as alkyl-, alkoxy- or halogen-derivatives of the above acids such as chloroterephthalic acid, dichloroterephthalic acid, bromoterephthalic acid, methylterephthalic acid, dimethylterephthalic acid, ethylterephthalic acid, methoxyterephthalic acid, and ethoxyterephthalic acid.

Exemplified as the above alicyclic dicarboxylic acid compounds (A2) are alicyclic dicarboxylic acids such as trans-1,4-cyclohexanedicarboxylic acid, cis-1,4-cyclohexanedicarboxylic acid, and 1,3-cyclohexanedicarboxylic acid; as well as alkyl-, alkoxy- or halogen-derivatives of the above alicyclic dicarboxylic acids such as trans-1,4-(1-methyl)-cyclohexanedicarboxylic acid and trans-1,4-(1-chloro)cyclohexanedicarboxylic acid.

Exemplified as the above aromatic hydroxycarboxylic acid compounds (B) are aromatic hydroxycarboxylic acids such as 4-hydroxybenzoic acid, 3-hydroxybenzoic acid, 6-hydroxy-2-naphthoic acid, and 6-hydroxy-1-naphthoic acid; as well as alkyl-, alkoxy- or halogen-derivatives of the above aromatic hydroxycarboxylic acids such as 3-methyl-4-hydroxybenzoic acid, 3,5-dimethyl-4-hydroxybenzoic acid, 2,6-dimethyl-4-hydroxybenzoic acid, 3-methoxy-4-hydroxybenzoic acid, 3,5-dimethoxy-4-hydroxybenzoic acid, 6-hydroxy-5-methylnaphthoic acid, 6-hydroxy-5-methoxynaphthoic acid, 2-chloro-4-hydroxybenzoic acid, 3-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 6-hydroxy-5-chloro-2-naphthoic acid, 6-hydroxy-7-chloro-2-naphthoic acid, and 6-hydroxy-5,7-dichloro-2-naphthoic acid.

Exemplified as the above aromatic diols (C1) are 4,4'-dihydroxydiphenyl, 3,3'-dihydroxydiphenyl, 4,4'-dihydroxytriphenyl, hydroquinone, resorcinol, 2,6-naphthalenediol, 4,4'-dihydroxydiphenyl ether, bis(4-hydroxyphenoxy)-ethane 3,3'-dihydroxydiphenyl ether, 1,6-naphthalenediol, 2,2-bis(4-hydroxyphenyl)propane, bis(4-hydroxyphenyl)-methane; as well as alkyl-, alkoxy- or halogen-derivatives of the above aromatic diols such as chlorohydroquinone, methylhydroquinone, t-butylhydroquinone, phenylhydroquinone, methoxyhydroquinone, phenoxyhydroquinone, 4-chlororesorcinol, and 4-methylresorcinol.

Exemplified as the above alicyclic diols (C2) are trans-1,4-cyclohexanediol, cis-1,4-cyclohexanediol, trans-1,4-cyclohexanedimethanol, cis-1,4-cyclohexanedimethanol, trans-1,3-cyclohexanediol, cis-1,2-cyclohexanediol, and trans-1,3-cyclohexanedimethanol; as well as alkyl-, alkoxy- or halogen-derivatives of the above alicyclic diols such as trans-1,4-(1-methyl)cyclohexanediol and trans-1,4-(1-chloro)cyclohexanediol.

Exemplified as the above aliphatic diols (C3) are straight-chain or branched-chain aliphatic diols such as ethylene glycol, 1,3-propanediol, 1,4-butanediol, and neopentyl glycol.

Exemplified as the above aromatic dithiols (D1) are benzene-1,4-dithiol, benzene-1,3-dithiol, 2,6-naphthalene-dithiol, and 2,7-naphthalene-dithiol.

Exemplified as the above aromatic mercaptocarboxylic acids (D2) are 4-mercaptobenzoic acid, 3-mercaptobenzoic acid, 6-mercapto-2-naphthoic acid, and 7-mercapto-2-naphtoic acid.

Exemplified as the above mercaptophenol (D3) are 4-mercaptophenol, 3-mercaptophenol, 6-mercaptophenol, and 7-mercaptophenol.

Exemplified as the above aromatic hydroxylamines and aromatic diamines (E) are 4-aminophenol, N-methyl-4-aminophenol, 1,4-phenylenediamine, N-methyl-1,4-phenylenediamine, N,N'-dimethyl-1,4-phenylenediamine, 3-aminophenol, 3-methyl-4-aminophenol, 2-chloro-4-aminophenol, 4-amino-1-naphthol, 4-amino-4'-hydroxydiphenyl, 4-amino-4'-hydroxydiphenyl ether, 4-amino-4'-hydroxydiphenylmethane, 4-amino4'-hydroxydiphenyl sulfide, 4,4'-diaminophenyl sulfide (thiodianiline), 4,4'-diaminodiphenyl sulfone, 2,5-diaminotoluene, 4,4'-ethylenedianiline, 4,4'-diaminodiphenoxyethane, 4,4'-diaminodiphenylmethane (methylenedianiline), 4,4'-diaminodiphenyl ether (oxydianiline).

The thermotropic liquid crystal polymer used in the present invention can be prepared from the above-mentioned compounds by various ester forming processes such as melt acidolysis method and slurry polymerization method.

In the thermotropic liquid crystal polymer used in the present invention is also included the one in which a part of a high polymer chain is composed of a polymer segment forming an anisotropic molten phase and the remaining portion is composed of a segment of thermoplastic resin which does not form the anisotropic molten phase. Furthermore, the thermotropic liquid crystal polymer of the invention includes those prepared by compounding a plurality of thermotropic liquid crystal polymers.

These thermotropic liquid crystal polymers are desirably polymers or copolymers which contain at least 10 mole %, preferably 20 to 80 mole %, of the monomer unit represented by the following general formula:

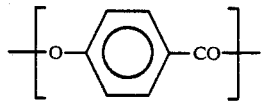

More particularly, the polymers are represented by the following formulae:

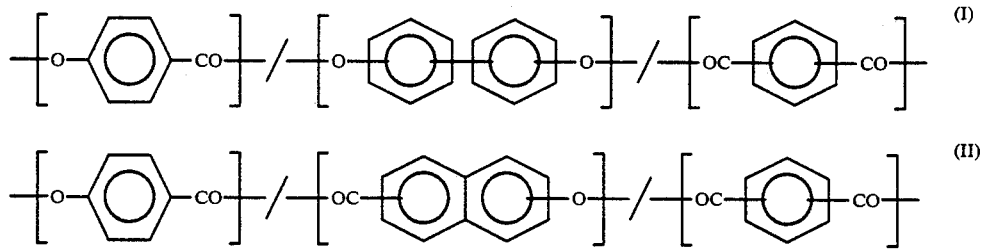

In the case that wholly-aromatic thermotropic liquid crystal polyesters in which substantially all the components are composed of aromatic compounds have the melting point not lower than 300° C., the hydrolysis by coexisting moisture and catalytic action by organic fillers are accelerated. Therefore, quite a large advantage can be expected by adopting the present invention.

The inorganic fillers used in the present invention are conventional ones which are used for metal plating, and the fillers are soluble in acid or alkali solutions under ordinary conditions and the concentrations in the etching step as the pretreatment of metal plating.

More particularly, the fillers are exemplified by carbonates of alkaline earth metals such as magnesium and calcium. These salts are weak alkali and they are liable to hydrolyze the thermotropic liquid crystal resin, accordingly, a large effect can be produced by adopting the present invention. Among them, the most preferable one is calcium carbonate.

Incidentally, sulfates of alkaline earth metals cannot be dissolved easily in acids or alkalis. Therefore, they are not desirable because the treatment of etching in metal plating is not easy.

As the calcium carbonate, those used as a resin filler which are available in the market can be employed, which are exemplified by light calcium carbonate and heavy calcium carbonate.

The particle size of the inorganic filler is not limited especially. The average particle diameter may be in the range of 1 to 20 $\mu$m, and preferably 2 to 10 $\mu$m for the use of metal plating. When a filler of smaller particle diameter is used, the state of the surface to be plated is good and final products having smooth surfaces can be obtained. However, when the particle size is too small, the adhesive strength of plating is not good. On the other hand, if the particle size of a filler is too large, the adhesive strength as well as surface smoothness are not satisfactory.

In inorganic fillers, especially with regard to calcium carbonate, high quality material scarcely containing impurities is desirable, where the total quantity of metallic impurities such as alumina and iron oxide is preferably not more than 1%.

As a commercially available calcium carbonate, heavy calcium carbonate of KS-500 (trademark, made by Dowa Calfine Co., Ltd.) is exemplified.

The quantity of use of the inorganic filler is 5 to 60% by weight, preferably 30 to 50% by weight, to the total weight of the thermotropic liquid crystal polymer composition. When the quantity of filler is smaller than 5% by weight, the plating strength is insufficient; meanwhile, the filler of more than 60% by weight impairs the workability in forming and the smoothness of the surfaces of plated articles.

The commercially available calcium carbonate contains considerable quantity of adsorbed moisture when it is not especially dried. This moisture causes the hydrolysis in the kneading step. Because the calcium carbonate is weak alkali, the resins specified in the present invention tends to be hydrolyzed.

Furthermore, it should be noted that the thermotropic liquid crystal resin itself also contains adsorbed moisture.

Therefore, in the present invention, it is necessary that the moisture content of the materials to be fed to the melting step in the preparation process of the resin composition and the formed articles, must be kept at 0.1% by weight or lower.

The apparatus used for the melting step are exemplified by melt-mixing machines, melt-kneading machines, extruders and various kinds of molding machines. The cases in which the melting step is employed, are exemplified by a procedure to prepare formed articles or resin composition in the form of pellets or else by mixing necessary component materials and melting the mixture; a procedure to prepare formed articles by melting the above pellets or the mixture of pellets and other additives; a procedure to prepare secondary composition in pellets by melt-mixing or melt-kneading the above pellets or a mixture of pellets and other additives; a procedure to prepare a master batch containing a large quantity of inorganic filler; and a procedure to prepare a secondary composition in pellets or formed articles by using the above master batch.

In the melting step as described above, the materials are heated at a high temperature such as at 300° C. and the molten resin exhibits the liquid crystal property, therefore, the existence of moisture more than 0.1% by weight causes the formation of hydrolyzed products and uneven distribution of the hydrolyzed products with losing the advantage of the present invention. Especially, it is not desirable because the plating strength is lowered when formed articles are applied with metal plating.

The above moisture content can be determined by any know methods. For example, the moisture determination method using Karl Fischer's reagent can be employed.

In order to reduce the moisture content of the materials fed to the melting step, for instance, an inorganic filler and a resin are previously dried separately and then they are fed together to a melting apparatus such as a kneader or a molding machine. When the resin is powder, it is possible to blend the resin powder and the filler and then to dry. Of course, both the above methods can be employed together. As described later, the re-absorption of moisture after the drying must be avoided with great care. That is, the dried materials must be prevented from moistening by sealing with dried air or heating properly.

For example, with regard to the inorganic fillers, the effect of drying can be produced to some extent by means of an ordinary drying method. However, the inorganic filler such as calcium carbonate is effectively dried by heating it for 2 or more hours at higher temperatures (150° to 400° C.) below its decomposition temperature.

Because a dried material often absorbs moisture again, the re-absorption of moisture is avoided by feeding, for example, dried calcium carbonate into a heated feed hopper immediately after the drying. It is desirable that the temperature of the feed hopper is higher than 150° C.

Furthermore, it is also possible to add various additives to the composition of the present invention as far as the function of the invention is not impaired.

Exemplified as the additives are organic fillers, stabilizers, UV absorbers, pigments, dyes, modifiers and inorganic fillers besides the carbonates of alkaline earth metals.

In addition, several thermoplastic resins and thermosetting resins besides wholly-aromatic thermotropic liquid crystal polyesters, can also be added.

Still further, a proper quantity of reinforcing materials such as glass fiber, carbon fiber and various kinds of whiskers can be compounded. When the quantity of fiber exceeds 30% by weight of a resin composition, it is difficult to produce formed articles of smooth surfaces, and when the sum of the fiber and calcium carbonate exceeds 70% by weight, the workability in forming is impaired.

When the thermotropic liquid crystal polymer and the inorganic filler, and further the above additive are mixed together, various known measures can be employed without any limitation. For example, they are fed into an extruder separately and melted and mixed together, or they are previously mixed by using a mixing machine such as Henschel mixer or tumbler and the obtained mixture is fed into an extruder.

The forming of the resin composition in the present application is generally carried out by conventional injection molding method. It is, however, possible to employ other known methods such as extrusion and compression molding.

When metal plating is applied to the formed articles obtained through the method of the present invention, etching by acid or alkali treatment is done as a pretreatment according to a conventional method. Furthermore, before the etching, degreasing of formed articles is optionally carried out.

The acid treatment as the etching is carried out generally at 40° to 80° C. for 1 to 120 minutes using a concentrated aqueous acid solution, for example, 70% by weight or higher aqueous solution of a single acid or mixed acids such as sulfuric acid, bichromic acid, chromic acid anhydride, phosphoric acid, pyrophosphoric acid, p-toluenesulfonic acid, and permanganic acid.

The alkali treatment is carried out at 30° to 80° C. for 1 to 120 minutes using a 10 to 70% by weight aqueous solution of hydroxides or oxides of alkali metals such as sodium, potassium and lithium, and alkaline earth metals such as strontium and barium.

In the alkali treatment, it is possible to perform the etching by using a mixed solution of the alkali etching solution and one or more kinds of organic solvents including alcohols such as methyl alcohol, ethyl alcohol, isopropyl alcohol and isobutyl alcohol; ethers such as tetrahydrofuran; nitrogen compounds such as ethylamine, dimethylamine, trimethylamine, propylamine, aniline, pyridine, and formamide; and halides of aromatic hydrocarbons such as chlorobenzene and o-, m- or p-dichlorobenzene. Furthermore, appropriate surface active agents can be also added to the alkaline etching solution.

In the method of etching treatment in the present invention, the above alkali treatment, especially the treatment using potassium hydroxide can produce desirable effects.

After the etching treatment, the treated articles are washed with water or hot water appropriately, which is followed by neutralization with an acid or alkali and then after washing, the treated articles are delivered to the next plating step.

The metal plating is carried out according to a conventional method, which is exemplified by chemical plating, vacuum deposition coating and flame spray coating known as the method for plating plastic articles.

In the present invention, the formed articles are made of the resin composition composed of wholly-aromatic liquid crystal polyester and an inorganic filler, where the moisture content of materials to be fed to the melting step is reduced as low as 0.1% by weight or less. Such formed articles are excellent in thermal resistance, mechanical strength and external appearance, thereby providing the formed articles which exhibits good adherence of plated layer, i.e., large plating strength.

The formed articles prepared by using the composition of the present invention are suitable for use in manufacturing electric and electronic parts and accessories, as well as machinery, automobile parts and office supplies which require metal plating, printing, vacuum deposition coating, varnish coating, adhesion and so forth. In addition, the formed articles of the invention is quite suitable for use in manufacturing substrate boards of printed circuits in which metal plating is inevitable.

In addition, the present invention can be put into practice quite economically because the formed articles suitable for metal plating can be produced using inexpensive fillers of carbonates of alkaline earth metals.

The present invention will be described in more detail with reference to several examples, in which these examples only show the state of working but by no means restrict the scope of the present invention.

EXAMPLE 1

Heavy calcium carbonate of 4 μm in particle diameter (trademark: KS-500; made by Dowa Calfine Co., Ltd.) was dried for 8 hours at 150° C. The dried calcium carbonate was then mixed with the same weight of wholly-aromatic copolyester (melting point by DSC: higher than 300° C.) with avoiding moisture absorption, using Henschel mixer. The wholly-aromatic thermotropic liquid crystal polyester is synthesized from phthalic acid, isophthalic acid, 4-hydroxybenzoic acid and 4,4'-dihydroxydiphenyl in the molar ratio of 3:1:8:4, respectively. The obtained mixture was kept at 150° C. and was pelletized by feeding it promptly into the feed hopper of a twin-screw extruder (model: PCM-30, made by Ikegai Iron Works, Ltd.) and kneading at 350° C.

The obtained pellets were immediately fed into an injection molding machine (model: IS 80, made by Toshiba Machine Co., Ltd.) with avoiding moisture absorption and formed into flat plates of 100 mm×100 mm×2 mm, under the conditions of barrel temperature: 380° C., injection pressure: 1,000 kgf/cm², and mold temperature: 150° C.

A sample of the resin mixture was taken from the outlet of Henschel mixer (inlet of the twin-screw extruder) and a sample of pellets, from the outlet of the extruder. These samples were subjected to ordinary measurement of moisture content using Karl Fischer's reagent with heating the samples at 150° C. for about 1 hour. As the result, the moisture content of the resin mixture was 200 ppm (0.02 wt. % and that of the pellets, 50 ppm).

The above flat plates were cut into pieces of 50 mm×100 mm×2 mm, and subjected to the following treatments in order.

| | | |
|---|---|---|
| (a) | Degreasing<br>ACE CLEAN A-220<br>(trademark, made by Okuno Chemical<br>Industries, Co., Ltd.) | 70° C., 15 min. |
| (b) | Etching<br>Aqueous soln. of potassium hydroxide<br>(concentration: 500 g/lit.) | 70° C., 30 min. |
| (c) | Neutralization<br>5% aqueous soln. of hydrochloric acid | 25° C., 2 min. |
| (d) | Conditioning<br>CONDERISER SP<br>(trademark, made by Okuno Chemical<br>Industries, Co., Ltd.) | 45° C., 5 min. |
| (e) | Catalyzing<br>CATALYST C<br>(trademark, made by Okuno Chemical<br>Industries, Co., Ltd.) | 25° C., 5 min. |
| (f) | Acceleration<br>Diluted sulfuric acid | 45° C., 15 min. |
| (g) | Electroless Plating<br>OPC-700 (M)<br>(trademark, made by Okuno Chemical<br>Industries, Co., Ltd.<br>thickness of plating: 10 μm) | 25° C., 15 min. |
| (h) | Electroplating<br>Electroplating was done by an ordinary plastics<br>plating method using a copper sulfate/sulfuric acid<br>bath, to form 50 μm thick plating. | |

After that, the plated articles were subjected to peeling test. In the first place, parallel cut lines leaving 10 mm distance apart were formed in the plated surface. One end of the plated layer was pinched and it was pulled up at an angle of 90° with the surface of the test piece to peel off the plated layer to obtain plating strength. The external appearance was also observed.

Meanwhile, the above obtained pellets were immediately fed into an injection molding machine (trademark: NESTAL SG 25, made by Sumitomo Heavy Industries, Ltd.) and formed into test pieces for bending test (ASTM D-638) under the conditions of barrel temperature: 380° C., injection pressure: 1,000 kgf/cm², and mold temperature: 150° C. Using the obtained test pieces, bending strength and thermal deformation temperature were tested.

EXAMPLE 2

The measurement of several properties were done in the like manner as in Example 1 except that the quantity of calcium carbonate was changed to 30% by weight.

Moisture contents were determined with regard to similar samples as those in Example 1 to obtain results of 280 ppm (0.028 wt. %) of moisture in the resin mixture and 50 ppm, in the pellets.

EXAMPLE 3

The measurement of several properties were done in the like manner as in Example 1 except that the drying conditions were changed to 300° C. for 2 hours.

Moisture contents were determined with regard to similar samples as those in Example 1 to obtain results of 180 ppm (0.018 wt. %) of moisture in the resin mixture and 30 ppm in the pellets.

COMPARATIVE EXAMPLE

The same calcium carbonate as the one in Example 1 was used without previous drying and its 50 parts by weight was mixed in Henschel mixer with 50 parts by weight of the same wholly-aromatic co-polyester as the one in Example 1. In the like manner as in Example 1, the mixture was kneaded without delay at 350° C. by a twin-screw extruder to obtain pellets. These pellets were immediately used for forming flat plates in the like manner as in Example 1 with an injection molding machine. The obtained plates were then subjected to evaluation test.

A sample of the mixture of the resin and the filler was taken from the outlet of Henschel mixer (inlet of the twin-screw extruder) and it was subjected to measurement of moisture content using Karl Fischer's reagent with heating the sample at 150° C. for about 1 hour. As a result, the moisture content of the mixture was 2,000 ppm (0.2 wt. %).

The foregoing results are shown in the following Table 1.

TABLE 1

| Item | Unit | Exam. 1 | Exam. 2 | Exam. 3 | Comp. Exam. |
|---|---|---|---|---|---|
| Plating Strength | kgf/cm | 1.7 | 1.4 | 1.3 | 1.0 |
| External(*) Appearance | — | + | + | + | — |
| Bending Strength | kgf/cm$^2$ | 1000 | 1050 | 940 | 540 |
| Flexural Modulus | kgf/mm$^2$ | 870 | 820 | 820 | 600 |
| Heat Distortion Temperature | °C. | 240 | 230 | 230 | 210 |

Notes:
External Appearance(*):
+: Smooth
—: Practically acceptable but roughness is observed partially As compared with Comparative Examples, better results were obtained in Example 1 in connection with all the items of plating strength, external appearance, and mechanical strengths by feeding materials containing not more than 0.1% by weight of moisture into melting step. In addition, several test pieces could be formed by injection molding without any problem.

As compared with Examples, the plating strength is markedly low in Comparative Example and other properties were also dissatisfactory. Furthermore, in the formation of flat plates and test pieces, the driveling of resin from a nozzle is liable to occur which causes troubles in forming process.

In view of the above-described results, it was understood that the use of feed materials containing severely limited quantity of moisture is quite effective and this fact has made possible the production of resin compositions and formed articles having excellent plating characteristics with using inexpensive filler such as calcium carbonate.

What is claimed is:

1. A method for preparing a resin composition having improved plating strength comprising mixing a wholly-aromatic thermotropic liquid crystal polyester resin with an alkaline earth carbonate inorganic filler, said filer present in said mixture in an amount in the range of between 5 % to 60% by weight, based on the total weight of the mixture, wherein the mixture has a moisture content of 0.1% by weight or less, based on the total weight of said mixture; and melting said mixture.

2. A method in accordance with claim 1 wherein said wholly-aromatic thermotropic liquid crystal polyester resin has a melting point of at least 300° C.

3. A method in accordance with claim 1 wherein said wholly-aromatic thermotropic liquid crystal polyester resin includes the monomeric unit represented by the formula

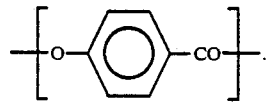

4. A method in accordance with claim 1 wherein the average particle size of said inorganic filler is in the range of 1 to 20 μm.

5. A method in accordance with claim 4 wherein said inorganic filler is calcium carbonate.

6. A method for preparing a plated resin composition comprising melt forming an article made of said resin composition of claim 1; pretreating said article with an acid or an alkali; and thereafter metal plating said article.

* * * * *